US008610126B2

(12) United States Patent
Park

(10) Patent No.: US 8,610,126 B2
(45) Date of Patent: Dec. 17, 2013

(54) FLAT PANEL DISPLAY DEVICE WITH SIMPLIFIED EFFICIENT STRUCTURE AND METHOD OF MANUFACTURING THE SAME

(75) Inventor: Kyung-Min Park, Yongin (KR)

(73) Assignee: Samsung Display Co., Ltd. (KR)

( * ) Notice: Subject to any disclaimer, the term of this patent is extended or adjusted under 35 U.S.C. 154(b) by 69 days.

(21) Appl. No.: 13/042,986

(22) Filed: Mar. 8, 2011

(65) Prior Publication Data

US 2011/0241010 A1  Oct. 6, 2011

(30) Foreign Application Priority Data

Apr. 1, 2010 (KR) .................. 10-2010-0030000

(51) Int. Cl.
*H01L 33/60* (2010.01)

(52) U.S. Cl.
USPC .................................................. 257/72

(58) Field of Classification Search
USPC .................................................. 257/59, 72
See application file for complete search history.

(56) References Cited

U.S. PATENT DOCUMENTS

| 7,180,156 B2 * | 2/2007 | Chang et al. .............. 257/535 |
| 7,768,012 B2 * | 8/2010 | Cheng ....................... 257/59 |
| 2003/0189210 A1 * | 10/2003 | Yamazaki et al. .......... 257/72 |
| 2003/0197179 A1 * | 10/2003 | Yamazaki et al. .......... 257/59 |
| 2006/0033169 A1 | 2/2006 | Hotta |
| 2007/0284586 A1 * | 12/2007 | Park et al. .................. 257/72 |
| 2008/0012470 A1 * | 1/2008 | Heo et al. .................. 313/500 |
| 2008/0012484 A1 * | 1/2008 | Park et al. .................. 313/509 |
| 2011/0012104 A1 * | 1/2011 | Kang et al. ................. 257/43 |
| 2011/0014735 A1 * | 1/2011 | Park et al. .................. 438/34 |

(Continued)

FOREIGN PATENT DOCUMENTS

| KR | 1993-0007567 B1 | 8/1993 |
| KR | 100270956 B1 | 8/2000 |

(Continued)

OTHER PUBLICATIONS

Official Action issued by the Korean Industrial Property Office dated Jun. 17, 2011 in Korean Patent Application No. 10-2010-0030000, 4 pages.

*Primary Examiner* — Nathan Ha
(74) *Attorney, Agent, or Firm* — Knobbe Martens Olson & Bear, LLP

(57) ABSTRACT

Provided are a flat panel display device and a method of manufacturing the same. The flat panel display device includes a first thin-film transistor including a first active layer, a first insulation layer disposed on the first active layer, and a first gate electrode disposed on the first insulation layer; a second thin-film transistor including a second active layer, the first insulation layer disposed on the second active layer, a second insulation layer disposed on the first insulation layer, and a second gate electrode disposed on the second insulation layer, and electrically connected to the first thin-film transistor; and a capacitor electrically connected to the first thin-film transistor and the second thin-film transistor. In the structure as described above, since different numbers of insulation layers are interposed between active layers and gate electrode in each of the first thin-film transistor and the second thin-film transistor, threshold voltages of the first thin-film transistor and the second thin-film transistor are significantly different from each other, and thus it becomes easy to control the threshold voltages of the first thin-film transistor and the second thin-film transistor.

9 Claims, 7 Drawing Sheets

(56) References Cited

U.S. PATENT DOCUMENTS

| | | | |
|---|---|---|---|
| 2011/0049507 A1* | 3/2011 | Choi | 257/43 |
| 2011/0108845 A1* | 5/2011 | Kwon et al. | 257/72 |
| 2012/0080685 A1* | 4/2012 | Yamazaki et al. | 257/72 |
| 2012/0193629 A1* | 8/2012 | Lin et al. | 257/59 |
| 2012/0205657 A1* | 8/2012 | Hayashi et al. | 257/59 |
| 2012/0261667 A1* | 10/2012 | Yamazaki et al. | 257/59 |

FOREIGN PATENT DOCUMENTS

| | | |
|---|---|---|
| KR | 1020020057016 A | 7/2002 |
| KR | 10-2002-080111 A | 10/2002 |
| KR | 10-2005-0045571 A | 5/2005 |
| KR | 10-0661417 B1 | 12/2006 |
| KR | 1020070002778 A | 1/2007 |
| KR | 10-2007-0072208 A | 7/2007 |

* cited by examiner

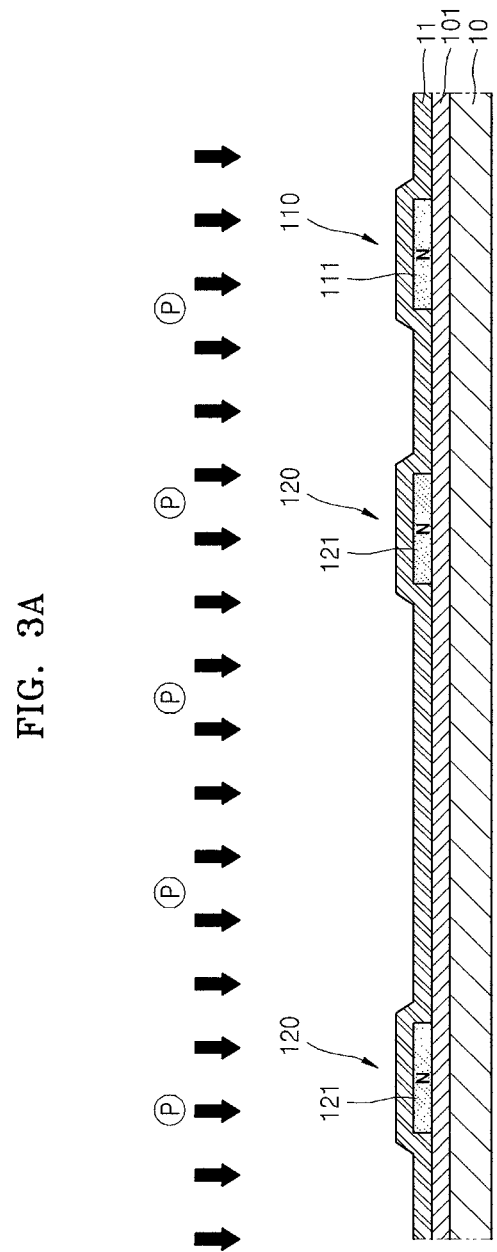

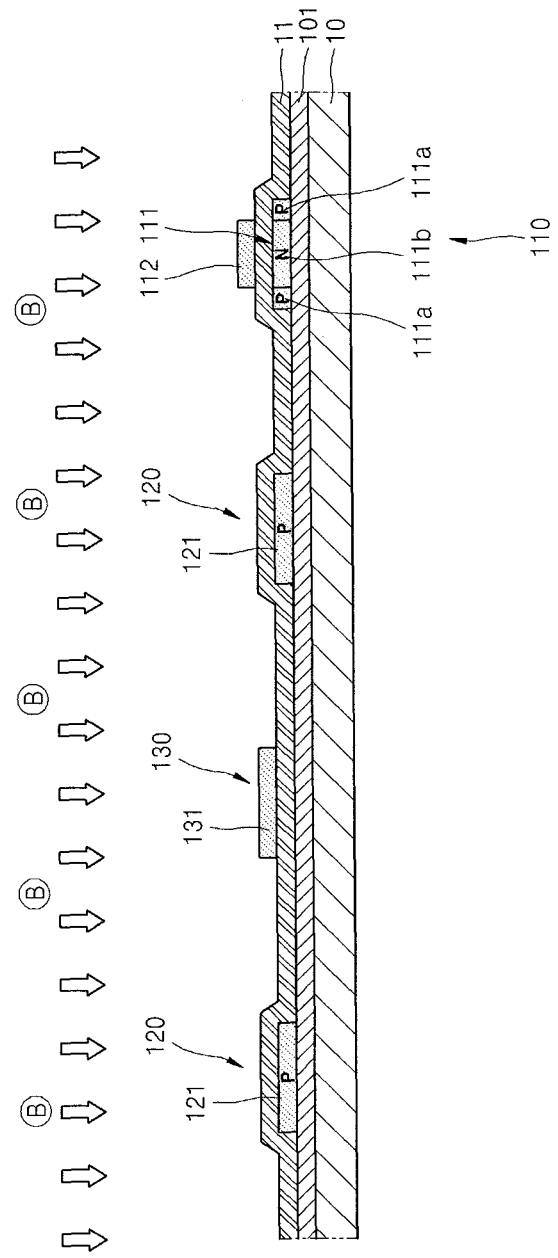

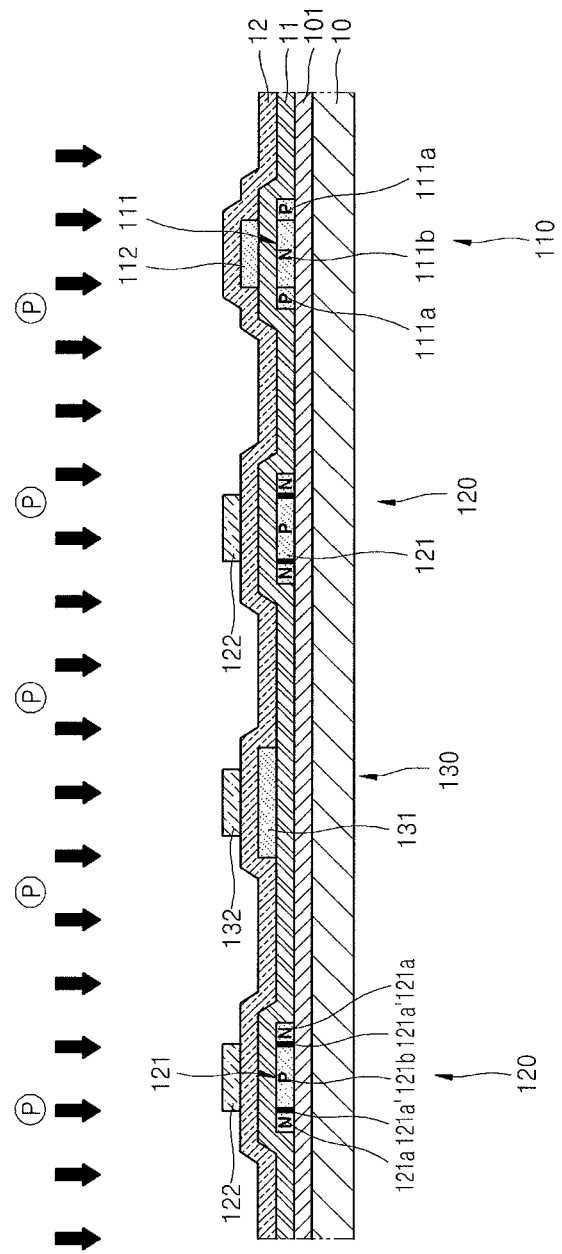

FLAT PANEL DISPLAY DEVICE WITH SIMPLIFIED EFFICIENT STRUCTURE AND METHOD OF MANUFACTURING THE SAME

CROSS-REFERENCE TO RELATED APPLICATIONS

This application claims the benefit of Korean Patent Application No. 10-2010-0030000, filed on Apr. 1, 2010, in the Korean Intellectual Property Office, the disclosure of which is incorporated herein in its entirety by reference.

BACKGROUND

1. Field

The present embodiments relate to a flat panel display device, such as a liquid crystal display device or an organic light emitting display device, and a method of manufacturing the same.

2. Description of the Related Technology

Generally, a flat panel display device, such as a liquid crystal display device or an organic light emitting display device, includes a plurality of thin-film transistors.

The thin-film transistors may include n-type thin-film transistors and p-type thin-film transistors.

Often, a structure doped with only one type of impurity may have two types of thin-film transistors by varying the concentration of the impurity between the two types. In this case, however, a difference between threshold voltages of the two types of thin-film transistors is not significant, and thus it becomes very difficult to control the structure.

The present embodiments overcome the above problems as well as provide additional advantages.

SUMMARY

The present embodiments provide a flat panel display device and a method of manufacturing the same, capable of fabricating a plurality of thin-film transistors in a simplified fabrication process and maintaining differences between threshold voltages of different types of thin-film transistors.

According to an aspect of the present embodiments, there is provided a flat panel display device including a first thin-film transistor including a first active layer, a first insulation layer disposed on the first active layer, and a first gate electrode disposed on the first insulation layer; a second thin-film transistor including a second active layer, the first insulation layer disposed on the second active layer, a second insulation layer disposed on the first insulation layer, and a second gate electrode disposed on the second insulation layer, and electrically connected to the first thin-film transistor; and a capacitor electrically connected to the first thin-film transistor and the second thin-film transistor.

The second insulation layer may extend onto the first gate electrode.

The capacitor includes a first electrode disposed on the first insulation layer; and a second electrode disposed over the second insulation layer, wherein the second insulation layer may be interposed between the first electrode and the second electrode.

The first gate electrode may comprise a material and the first electrode may comprise the same material, and the second gate electrode may comprise a material and the second electrode may comprise the same material.

The first active layer may include a first channel region that overlaps the first gate electrode and contains a first type impurity; and a first source region and a first drain region that are disposed on opposite sides of the first channel region and contain a second type impurity, of which the polarity is opposite to that of the first type impurity.

The first type impurity may be an n-type impurity, and the second type impurity may be a p-type impurity.

The second active layer may includes a second channel region that overlaps the second gate electrode and contains a second type impurity; a second source region and a second drain region that are disposed on opposite sides of the second channel region and contain a first type impurity, of which the polarity is opposite to that of the second type impurity; and regions with low impurity concentration that are disposed between the second channel region and the second source and drain regions and include the first type impurity at a concentration lower than that of the first impurity in the second source and drain regions.

The first type impurity may be an n-type impurity, and the second type impurity may be a p-type impurity.

According to another aspect of the present embodiments, there is provided a method of forming a flat panel display device, the method including (a) forming a first active layer of a first thin-film transistor and a second active layer of a second thin-film transistor; (b) forming a first insulation layer on the first active layer and the second active layer; (c) forming a second insulation layer on the first insulation layer on the second active layer; (d) forming a first gate electrode of the first thin-film transistor that faces the first active layer across the first insulation layer; and (e) forming a second gate electrode of the second thin-film transistor that faces the second active layer across the first insulation layer and the second insulation layer.

The second insulation layer may extend over the first gate electrode.

The method may further include implanting a first type impurity into the first active layer and the second active layer after the first insulation layer is formed.

The method may further include implanting a second type impurity, of which the polarity is opposite to that of the first type impurity, into the entire second active layer and a portion of the first active layer not covered by the first gate electrode, after the first gate electrode is formed and before the second insulation layer and the second gate electrode are formed.

The first type impurity may be an n-type impurity, and the second type impurity may be a p-type impurity.

The method may further include forming a first electrode of a capacitor between the first insulation layer and the second insulation layer by using a material used to form the first gate electrode.

The method may further include forming a first electrode of a capacitor on the first insulation layer by using a material used to form the first gate electrode.

The method may further include forming a metal layer on the second insulation layer; forming a first photoresist layer on the metal layer; patterning the first photoresist layer; and forming the second gate electrode and a second electrode of the capacitor by patterning a portion of the metal layer exposed by the patterned first photoresist layer.

The method may further include implanting a second type impurity into a portion of the first active layer not covered by the first gate electrode, before the first photoresist layer is patterned.

The method may further include forming a second photoresist layer to cover the first thin-film transistor; implanting a first type impurity into a portion corresponding to the second thin-film transistor which is covered by the first photoresist layer; and removing the first and second photoresist layers, after the second gate electrode and the second electrode are formed.

The method may further include forming regions with low impurity concentration by further implanting the first type impurity into a portion of the second active layer not covered by the second gate electrode, after the first and second photoresist layers are removed.

BRIEF DESCRIPTION OF THE DRAWINGS

The above and other features and advantages of the present embodiments will become more apparent by describing in detail exemplary embodiments thereof with reference to the attached drawings in which:

FIGS. 3A through 3E are sectional view showing a main process of fabricating a thin-film transistor unit shown in FIG. 2.

DETAILED DESCRIPTION

Hereinafter, the present embodiments will be described in detail by explaining preferred embodiments with reference to the attached drawings.

Figure 1:
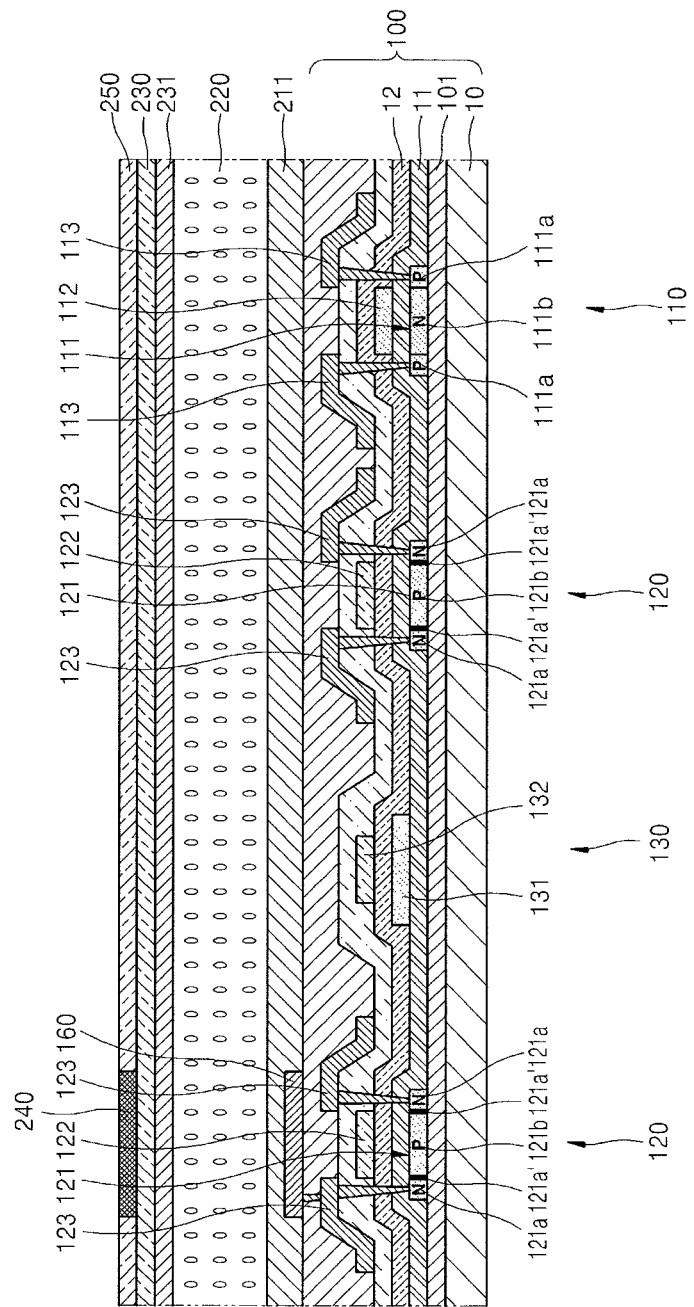
FIG. 1 is a sectional view of a liquid crystal display device according to an embodiment.
Figure 2:
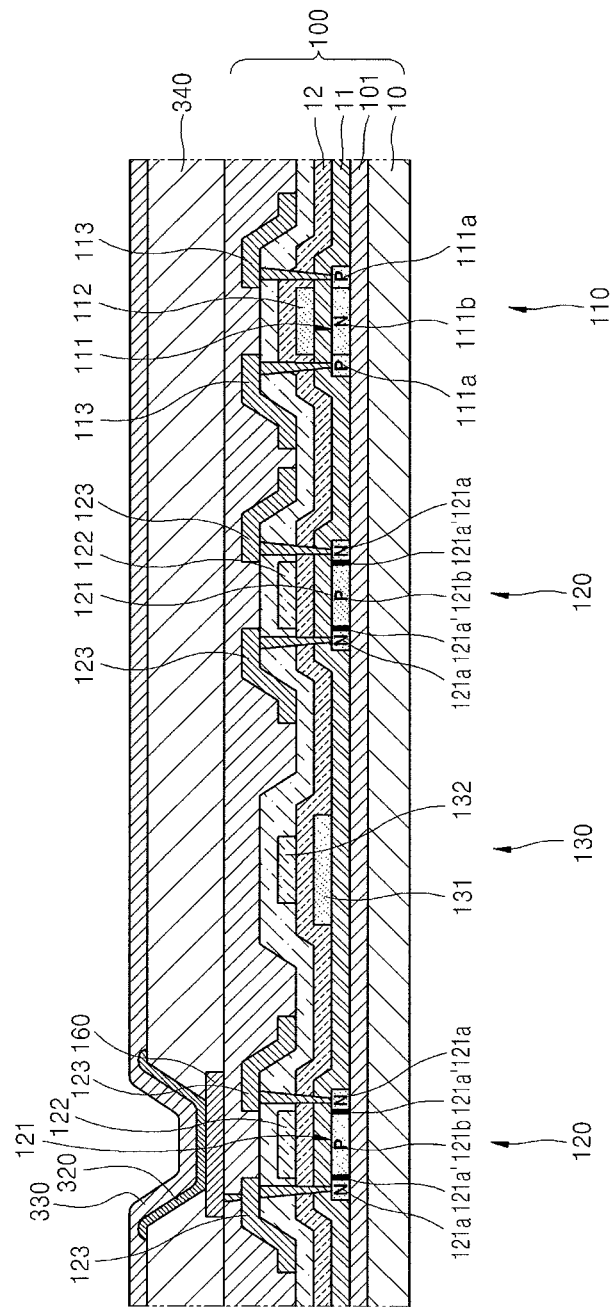
FIG. 2 is a sectional view of an organic light emitting display device according to an embodiment.

FIGS. 1 and 2 show flat panel display devices according to embodiments, where FIGS. 1 and 2 are sectional views of a liquid crystal display device and an organic light emitting display device, respectively. Both of the display devices include an array substrate 100 that include thin-film transistors and the structure of the array substrate 100 is the same in both the liquid crystal display device and the organic light emitting display device. However, a liquid crystal layer 220 is formed on the array substrate 100 in FIG. 1 and the liquid crystal layer is driven by the thin-film transistors in FIG. 1, whereas an organic light emitting layer 320 is formed on the array substrate 100 in FIG. 2 and the organic light emitting layer 320 is driven by the thin-film transistors in FIG. 2.

If a flat panel display device is the liquid crystal display device shown in FIG. 1, an arrangement of the liquid crystal layer 220 between a pixel electrode 160 and a counter electrode 230 is changed by an electric signal from the array substrate 100, and thus light from a backlight lamp (not shown), arranged behind a substrate 10, is selectively transmitted and an image is formed in front of the substrate 10. The liquid crystal display device also includes alignment films 211 and 231, a color filter 240, and a black matrix 250.

Furthermore, if a flat panel display device is the organic light emitting display device shown in FIG. 2, the organic light emitting layer 320, which is located between a pixel electrode and a counter electrode 330, emits light and forms an image when an electric signal from the array substrate 100 is transmitted to the organic light emitting layer 320. The organic light emitting display device also includes a pixel defining layer 340.

Therefore, as shown in FIGS. 1 and 2, the array substrate 100 for a flat panel display device described below may be used not in only one but in both a liquid crystal display device and an organic light emitting display device.

Referring to FIG. 1, the structure of the array substrate 100 stated above will be described.

As shown in FIG. 1, the array structure 100 includes a p-type thin-film transistor 110 (referred to hereinafter as a first thin-film transistor), n-type thin-film transistors 120 (referred to hereinafter as second thin-film transistors), and a capacitor 130 that are disposed on the substrate 10. The present embodiment provides a structure in which, as shown in FIG. 1, one of the second thin-film transistors 120 arranged to the left of the capacitor 130 is disposed in a pixel region as a pixel driving transistor connected to a pixel electrode 160 and another of the second thin-film transistors 120 and the first thin-film transistor 110 arranged to the right of the capacitor 130 are disposed outside of the pixel region. However, the structure shown in FIG. 1 is merely an example of a portion of the array structure 100, and it may be considered that a plurality of the second thin-film transistors 120, a plurality of the first thin-film transistors 110, and a plurality of the capacitors 130 can be arranged in the array structure 100. Furthermore, the array structure 100 may also include a buffer layer 101. However, the buffer layer 101 may be selectively arranged when necessary. For example, the buffer layer 101 may be arranged to improve planarization of the substrate 10.

Each of the second thin-film transistors 120 has a structure in which an N active layer 121 (referred to hereinafter as a second active layer), a first insulation layer 11, a second insulation layer 12, and an N gate electrode 122 (referred to hereinafter as a second gate electrode) are sequentially stacked. The two insulation layers 11 and 12 are interposed as a double layer between the second active layer 121 and the second gate electrode 122. The interposition of insulation layers as a double layer is effective for increasing a difference between a threshold voltage of the second thin-film transistors 120 and a threshold voltage of the first thin-film transistor 110, which will be described below. The second active layer 121 includes a center portion 121b (referred to hereinafter as a second channel region) doped with a p-type impurity, e.g., boron (B) ions and overlapping the second gate electrode 122, and side end regions 121a (referred to hereinafter as second source/drain regions) doped with an n-type impurity, e.g. phosphorous (P) ions, where regions with low impurity concentration 121a' doped with the n-type impurity at a low concentration as compared to the second source/drain regions 121a are formed between the second channel region 121b and the second source/drain regions 121a. The second source/drain regions 121a are connected to source/drain electrodes 123 through via holes. Here, the n-type impurity is an impurity for providing electrons, whereas the p-type impurity is an impurity for providing holes, and the n-type impurity and the p-type impurity will be referred to hereinafter as a first type impurity and a second type impurity, respectively.

The first thin-film transistor 110 has a structure in which a P active layer 111 (referred to hereinafter as a first active layer), the first insulation layer 11, a P gate electrode 112 (referred to hereinafter as a first gate electrode), and the second insulation layer 12 are sequentially stacked. Only the first insulation layer 11 is interposed as a single layer between the first active layer 111 and the first gate electrode 112. Therefore, as compared to the second thin-film transistor 120, in which the two insulation layers 11 and 12 are interposed as a double layer between the second active layer 121 and the second gate electrode 122, only the first insulation layer 11 is interposed as a single layer between the first active layer 111 and the first gate electrode 112, and thus a difference between the threshold voltage of the first thin-film transistor 110 and the threshold voltage of the second thin-film transistor 120 increases. The threshold voltages of the thin-film transistors 110 and 120 may be controlled easily. Since the threshold voltages of the thin-film transistors 110 and 120 are made significantly different by interposing different numbers of insulation layers between the second active layer 121 and the second gate electrode 122 and between the first active layer 111 and the first gate electrode 112, it becomes easy to control the threshold voltages of the thin-film transistors 110 and 120. Here, the first active layer 111 includes a center portion 111b (referred to hereinafter as a first channel region) doped with an n-type impurity, e.g., phosphorous (P) ions, and is overlapped by the first gate electrode 112, and side end portions 111a (referred to hereinafter as first source/drain regions) doped with a p-type impurity providing holes, e.g., boron (B) ions. The first source/drain regions 111a are connected to the source/drain electrodes 113 through via holes.

The capacitor 130 has a structure in which the first insulation layer 11, a first electrode 131, the second insulation layer 12, and a second electrode 132 are sequentially stacked. The capacitor 130 has a structure in which the second insulation layer 12 is interposed between the first and second electrodes 131 and 132. Accordingly, if only one insulation layer is interposed between the first and second electrodes 131 and 132, greater charge capacity may be expected as compared to a case in which two insulation layers are interposed therebetween.

The first thin-film transistor 110, the second thin-film transistors 120, and the capacitor 130 may be fabricated via a process shown in FIGS. 3A through 3E.

First, as shown in FIG. 3A, the second active layer 121 of the second thin-film transistors 120 and the first active layer 111 of the first thin-film transistor 110 are formed on the buffer layer 101 on the substrate 10. Each of the active layers 111 and 121 may comprise a silicon semiconductor, e.g., a poly-silicon.

The first insulation layer 11 is formed on the first active layer 111 and the second active layer 121 and the n-type impurity, for example, phosphorous (P) ions, are implanted into the first and second active layers 111 and 121. Both of the active layers 111 and 121 are doped with the n-type impurity, which provides electrons for the entire region. The first insulation layer 11 and the second insulation layer 12, which is described below, may comprise silicon oxide, tantalum oxide, aluminum oxide, or the like, for example.

As shown in FIG. 3B, the first electrode 131 of the capacitor 130 and the first gate electrode 112 of the first thin-film transistor 110 are formed on the first insulation layer 11. The first electrode 131 and the first gate electrode 112 may be formed using the same material. The first electrode 131 and the first gate electrode 112 are conductive metal layers, and may comprise, for example, molybdenum, ITO, or the like. Next, the first active layer 111 and the second active layer 121 are doped with a p-type impurity, for example, boron (B) ions. The entire second active layer 121 of the second thin-film transistor 120 is doped with the p-type impurity, and only the first source/drain regions 111a of the first active layer 111, which are not covered by the first gate electrode 112, is doped with the p-type impurity. The first channel region 111b at the center remains doped with the n-type impurity. Therefore, the first channel region 111b is an n-type impurity region, whereas the first source/drain regions 111a are p-type impurity regions.

Figure 3C:
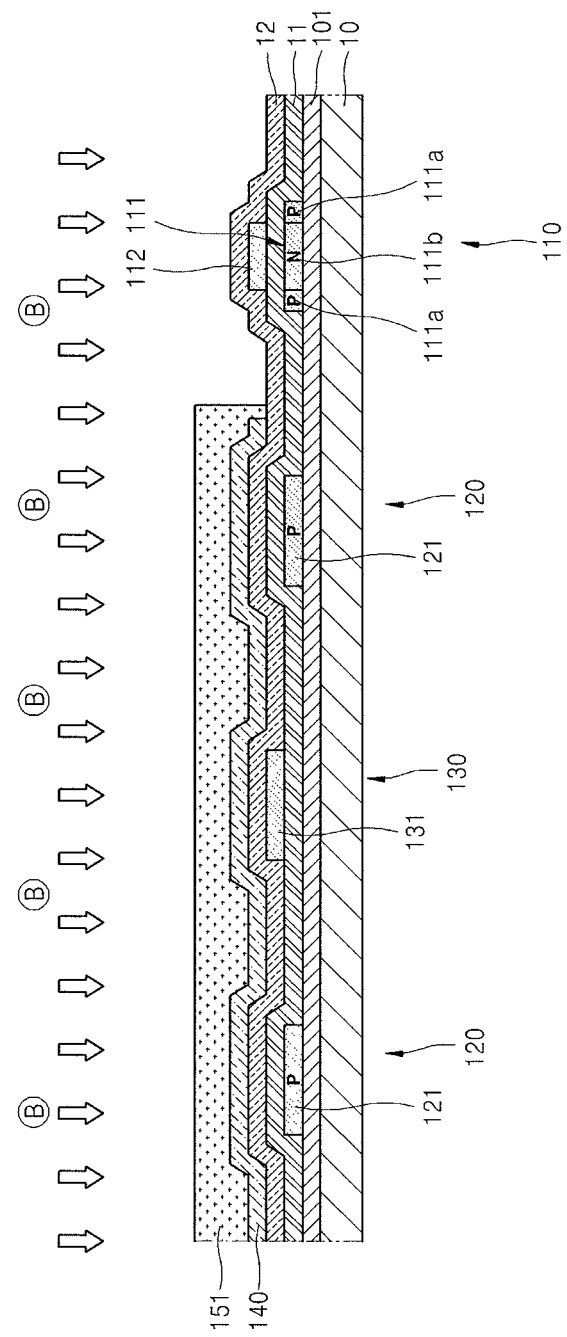

Next, as shown in FIG. 3C, the second insulation layer 12, a metal layer 140, and a first photoresist layer 151 are sequentially formed. The second insulation layer 12 is formed on all of the second thin-film transistors 120, the capacitor 130, and the first thin-film transistor 110, whereas the metal layer 140 and the first photoresist layer 151 are not formed on the first thin-film transistor 110 and are formed on the second thin-film transistors 120 and the capacitor 130. The metal layer 140 becomes the second gate electrode 122 described above of the second thin-film transistors 120 and the second electrode 132 of the capacitor 130, and the first photoresist layer 151 is a layer for patterning the second gate electrode 122 and the second electrode 132. The metal layer 140 may comprise molybdenum, ITO, or the like, for example. At this point, the p-type impurity, for example, boron (B) ions, is further implanted thereto. The second thin-film transistors 120 and the capacitor 130, which are covered by the first photoresist layer 151, are not doped with the p-type impurity, and only the first source/drain regions 111a of the first active layer 111 of the first thin-film transistor 110, which are not covered by the first photoresist layer 151, is doped with the p-type impurity. Therefore, the p-type impurity is added to the first source/drain regions 111a of the first active layer 111 of the first thin-film transistor 110. Since the first source/drain regions 111a are regions to be connected to the source/drain electrodes 113 in a later operation, the p-type impurity is further added to the first source/drain regions 111a to reduce contact resistance.

Figure 3D:
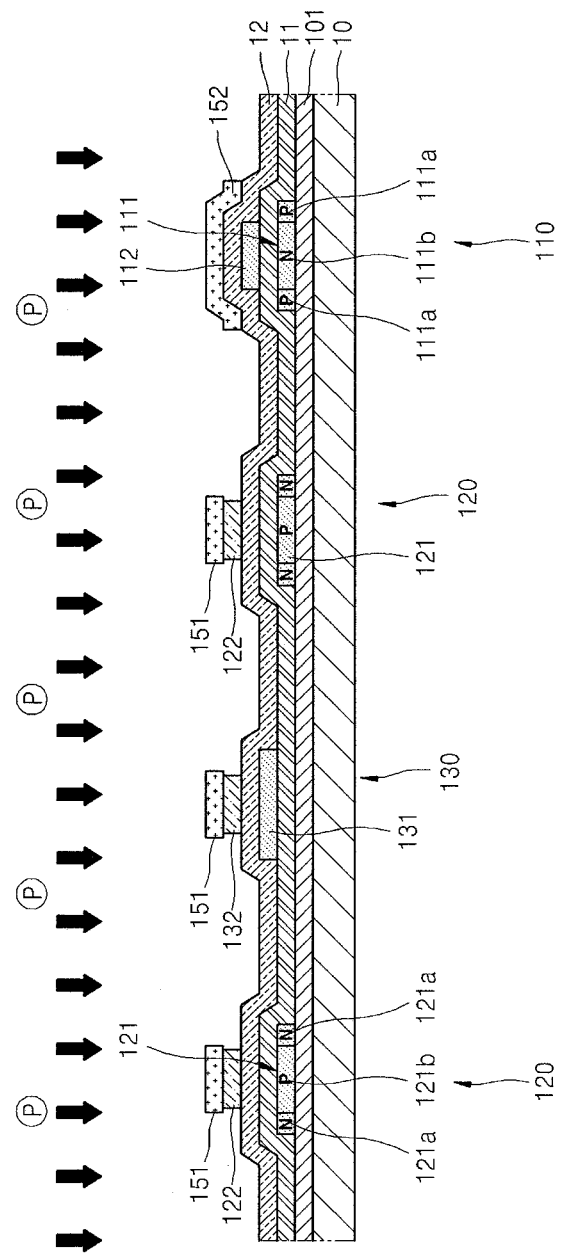

Next, as shown in FIG. 3D, when the first photoresist layer 151 and the metal layer 140 are patterned, the second gate electrode 122 of the second thin-film transistors 120 and the second electrode 132 of the capacitor 132 comprise the same material. At this point, the second gate electrode 122 and the second electrode 132 are slightly over-etched The over-etching is used in low concentration ion implantation below. At this point, a second photoresist layer 152 is formed on the first thin-film transistor 110, and the n-type impurity, for example, phosphorous (P) ions, are implanted thereto. Portions of the first active layer 111 and the second active layer 121 covered by the first and second photoresist layers 151 and 152 are not doped with the n-type impurity, and only the second source/drain regions 121a of the second active layer 121 of the second thin-film transistors 120, which are not covered, are doped with the n-type impurity. Therefore, in the second active layer 121 of the second thin-film transistors 120, the second channel region 121b is a p-type impurity region, whereas the second source/drain regions 121a are n-type impurity regions.

Next, the structure as shown in FIG. 3E may be acquired by removing the first and second photoresist layers 151 and 152 discussed above. At this point, implantation of the n-type impurity may be performed at least one more time if necessary. If the n-type impurity is implanted one more time, the impurity concentrations of the second source/drain regions 121a further increases, and the regions with low impurity concentration 121a' having a relatively low concentration are formed between the second source/drain regions 121a and the second channel region 121b. The portion of the second gate electrode 122 over-etched in FIG. 3D is exposed when the first photoresist layer 151 is removed. If the n-type impurity is further implanted thereto, the n-type impurity is newly implanted to the second active layer 121 via the exposed portion, and thus the regions with low impurity concentration 121a' having a relatively low concentration as compared to the second source/drain regions 121a are formed.

When the source/drain electrodes 113 and 123 are formed and are connected to the first active layer 111 and the second active layer 121 of each of the thin-film transistors 110 and 120 and the source/drain electrodes 123 of the second thin-film transistor 120 in the pixel region are connected to the pixel electrode 160, the array substrate 100 as shown in FIGS. 1 and 2 is fabricated. The liquid crystal display device as shown in FIG. 1 is manufactured by disposing the liquid crystal layer 220 on the array substrate 100 and installing components, such as the color filter 240. The organic light emitting display device as shown in FIG. 2 is manufactured by forming components, such as the organic light emitting layer 320 and a counter electrode 330 on the array substrate 100.

When a liquid crystal display device is manufactured by using the method as described above, the first thin-film transistor 110 and the second thin-film transistor 120 are doped together instead of being doped in separate masking operations, and thus the overall manufacturing process may be simplified.

Since the number of the insulation layers 11 and 12 interposed between the second active layer 121 and the second gate electrode 122 and between the first active layer 111 and the first gate electrode 112 of the first thin-film transistor 110 and the second thin-film transistors 120 are different from each other, a difference between threshold voltages of the first thin-film transistor 110 and the second thin-film transistors 120 becomes significant, and thus it is easy to control threshold voltages of the first thin-film transistor 110 and the second thin-film transistors 120.

Since only one insulation layer is interposed between the first and second electrodes 131 and 132, greater charge capacity may be expected as compared to a case in which two insulation layers are interposed between the first and second electrodes 131 and 132.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A flat panel display device comprising:
    a first thin-film transistor comprising a first active layer, a first insulation layer disposed on the first active layer, and a first gate electrode disposed on the first insulation layer;
    a second thin-film transistor comprising a second active layer, wherein the first insulation layer is disposed on the second active layer,
    a second insulation layer disposed on and contacting the first insulation layer, and a second gate electrode disposed on the second insulation layer, and electrically connected to the first thin-film transistor;
    a pixel electrode disposed to overlap the entire second active layer and the entire second gate electrode and contact a source region or a drain region; and
    a capacitor electrically connected to the first thin-film transistor and the second thin-film transistor.

2. The flat panel display device of claim 1, wherein the second insulation layer extends onto the first gate electrode.

3. The flat panel display device of claim 1, wherein the capacitor comprises:
    a first electrode disposed on the first insulation layer; and
    a second electrode disposed over the second insulation layer,
    wherein the second insulation layer is interposed between the first electrode and the second electrode.

4. The flat panel display device of claim 3, wherein the first gate electrode and the first electrode comprise the same material.

5. The flat panel display device of claim 3, wherein the second gate electrode and the second electrode comprise the same material.

6. The flat panel display device of claim 1, wherein the first active layer comprises:
    a first channel region that overlaps the first gate electrode and contains a first type impurity; and
    and the first source region and first drain region are disposed on opposite sides of the first channel region and contain a second type impurity, wherein the polarity of the second type impurity is opposite to that of the first type impurity.

7. The flat panel display device of claim 6, wherein the first type impurity is an n-type impurity, and the second type impurity is a p-type impurity.

8. The flat panel display device of claim 1, wherein the second active layer comprises:
    a second channel region that overlaps the second gate electrode and contains a second type impurity;
    a second source region and a second drain region that are disposed on opposite sides of the second channel region and contain a first type impurity, wherein the polarity of the first type impurity is opposite to that of the second type impurity; and
    regions with low impurity concentration that are disposed between the second channel region and the second source and drain regions and comprise the first type impurity at a concentration lower than that of the first impurity in the second source and drain regions.

9. The flat panel display device of claim 8, wherein the first type impurity is an n-type impurity, and the second type impurity is a p-type impurity.

* * * * *